United States Patent [19]

Kreider et al.

[11] Patent Number: 5,166,511

[45] Date of Patent: Nov. 24, 1992

[54] RADIATON-SENSITIVE SENSOR HAVING A PLURALITY OF RADIATION SENSITIVE ELEMENTS ARRANGED SUBSTANTIALLY CIRCULAR WITH RADIALLY DECREASING DENSITY

[75] Inventors: Gregory Kreider, Merrimack, N.H.; Cor L. M. Claeys, Kessel-Lo; Ingrid Debusschere, Linden, both of Belgium; Giulio Sandini, Genoa, Italy; Paolo Dario, Livorno, Italy; Vincenzo Tagliasco, Genoa, Italy

[73] Assignee: Interuniversitair Micro-Elektronica Centrum VZW, Leuven-Heverlee, Belgium

[21] Appl. No.: 635,103

[22] PCT Filed: May 8, 1990

[86] PCT No.: PCT/EP90/00818

§ 371 Date: Jan. 7, 1991

§ 102(e) Date: Jan. 7, 1991

[87] PCT Pub. No.: WO90/13915

PCT Pub. Date: Nov. 15, 1990

[30] Foreign Application Priority Data

May 8, 1989 [NL] Netherlands .......................... 8901156

[51] Int. Cl.⁵ .............................................. H01J 40/14
[52] U.S. Cl. ................................ 250/208.1; 250/214.1
[58] Field of Search ............ 357/30 H, 30 D, 24 L R; 250/211 J, 208.1, 561

[56] References Cited

U.S. PATENT DOCUMENTS 4,910,568  3/1990  Takei et al. ...................... 357/30 D Primary Examiner—David C. Nelms
Assistant Examiner—T. Davenport
Attorney, Agent, or Firm—Philip M. Shaw, Jr.

[57] ABSTRACT

A radiation sensitive device comprising several rings and a middle section formed by a conventional charge coupled device. Drain means for radial draining of the charges generated in the circular sections by the incident radiation and drain means for the charge coupled device are provided. The device has a retina-like structure and can be advantageously applied in robotics.

9 Claims, 3 Drawing Sheets

RADIATON-SENSITIVE SENSOR HAVING A PLURALITY OF RADIATION SENSITIVE ELEMENTS ARRANGED SUBSTANTIALLY CIRCULAR WITH RADIALLY DECREASING DENSITY

BACKGROUND OF THE INVENTION

The article "An Anthropomorphic Retina-like Structure for Scene Analysis" by Giulio Sandini and Vincenzo Tagliasco, published in Computer Graphics and Image Processing, Volume 14, No. 3, 1980, describes a retina-like structure of a radiation-sensitive means which has advantages over the prior art, for instance for application in robotics.

Further prior art is to be found in the novelty search report of the European Patent Office:

U.S. Pat. No. 4,645,681
Computer Graphics and Image Processing, vol. 14, no. 3, 1980,
EP-A-0203667
U.S. Pat. No. 4,131,793

As background of the present invention published lectures—held after the priority date of the present case—by the inventors are available:

ISCAS workshop (1989) to be published in: "Analog VLSI Implementation of Neural Systems";

Transducers 89 at Montreux, Jun. 25-30, 1989, paper to be published in "Sensors and Actuators";

Article by G. Sandini and P. Dario; Active Vision Based on Space - Variant Sensing;

SPIE vol. 1242, Charge-Coupled Devices and Solid State Optical Sensors (1990), by G. Kreider, J. Van der Spiegel, Dept. of Electrical Engineering University of Pennsylvania, Pa. 19104-6390.

SUMMARY OF THE INVENTION

The present invention has for its object to realize a retina-like radiation-sensitive device using CCD techniques.

The preferred embodiments of the present invention provide a device which is efficient in obtaining radiation information, such that only when an object is to be studied in detail, is a rectangular CCD having a high number of small pixels used. A (rougher) outline can be maintained by the outer parts.

Further advantages, features and details will become apparent in the light of a description of preferred embodiments according to the present invention, in which description reference is made to a drawing, in which:

DETAILED DESCRIPTION OF THE PREFERRED EMBODIMENT

Figure 1:
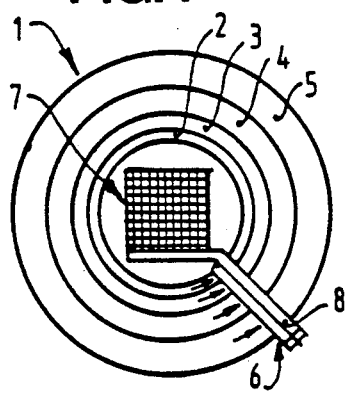
FIG. 1 shows a diagram of a first embodiment of the present invention.

A first embodiment 1 of a radiation-sensitive means according to the present invention comprises four rings 2, 3, 4 and 5 wherein charges generated by radiation in radiation-sensitive elements are carried via transfer elements (not shown) coupled to these radiation-sensitive elements to a drain means 6 consisting of drain elements for radial draining of this charge. In the center is a rectangular charge-coupled device 7 of known type provided with a drain means 8.

As stated above, the embodiment shown in FIG. 1 has advantages for use in robotics as the radial change of the density or resolution of radiation-sensitive elements here forms an approximation of the resolution of radiation-sensitive elements occurring in the human eye.

Figure 2:
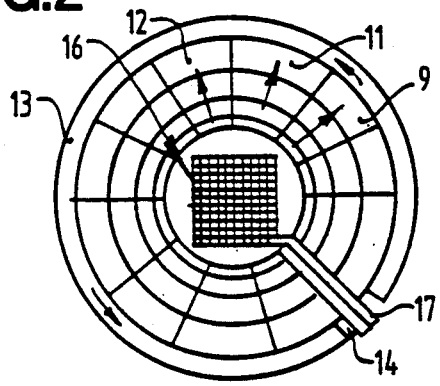
FIG. 2 shows a second embodiment of the present invention.

These advantages likewise obtain for the embodiment shown in FIG. 2, wherein the signals deriving from radiation-sensitive elements are transferred according to the arrows radially outward in sections 9, 11, 12 to an annular drain means 13 provided with an output connection 14. Disposed in the center is a rectangular or square CCD 16 provided with a radial drain means 17.

The radiation-sensitive means 18 (FIG. 3) according to the invention comprises a middle section 19, an inner ring 20, a central ring 21, an outer ring 22 and a radial drain means 23 wherein the signals transported in the direction of the arrows of both the central section 19 and the circular registers are combined.

Figure 3:
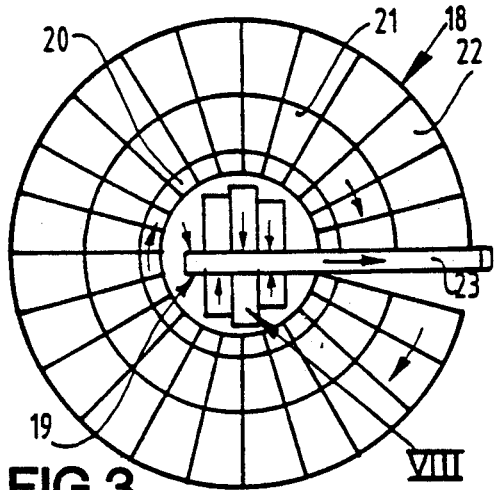
FIG. 3 shows a third, preferred embodiment according to the present invention.
Figure 4:
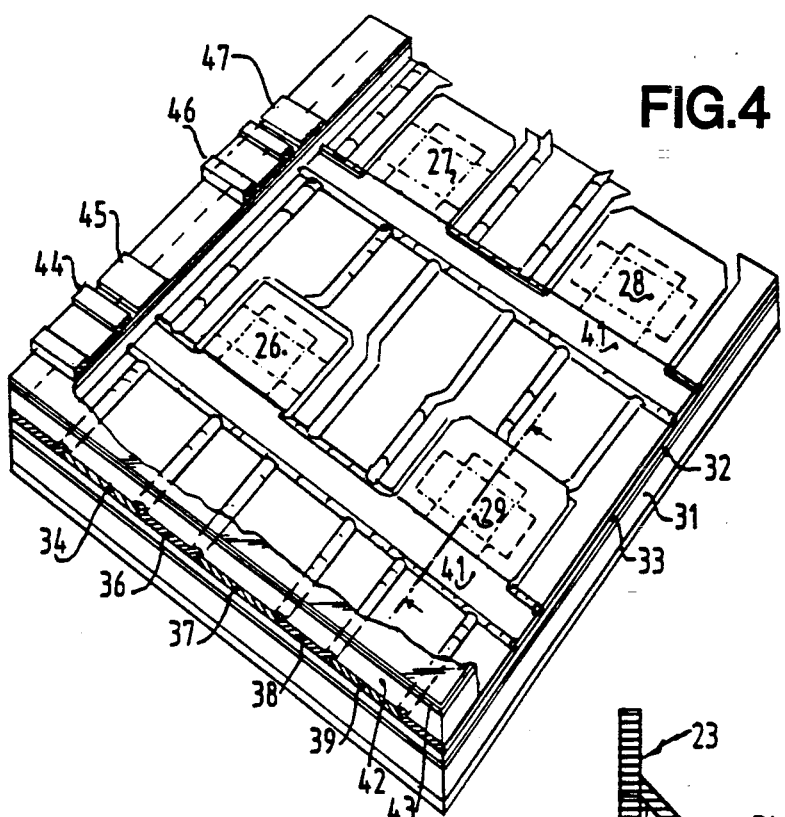
FIG. 4 is a partly broken away, perspective view of a detail of the embodiment of FIG. 3.

With the embodiment 18 of FIGS. 3 and 4 of the radiation-sensitive means, the operation is carried out with a basic element of standard design of a radiation-sensitive element having a transfer element coupled thereto. The basic elements of four radiation-sensitive elements and transfer elements coupled thereto are designed per ring 20, 21 and 22 using CAD techniques and the dimensions of such cells become greater in the radially outward direction. Although not shown in FIG. 3, a radially outer ring is smaller on the inner side thereof than on the outside of the preceding ring taken in the radially outward direction.

Figure 5:
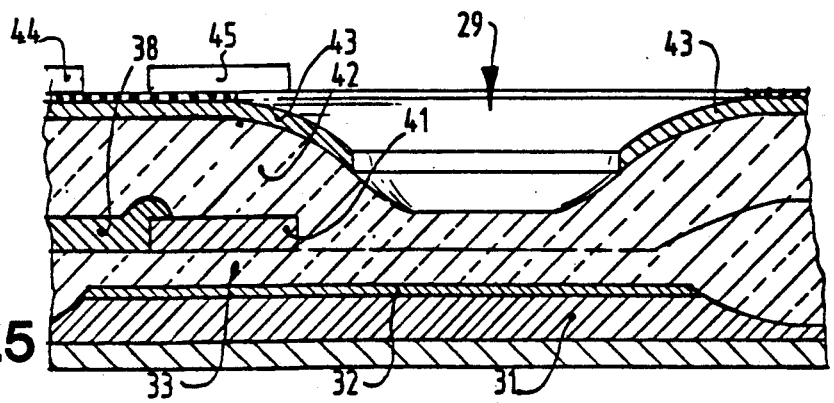
FIG. 5 is a sectional view along the line indicated by the arrows in FIG. 4.

As seen in FIGS. 4 and 5, a detail of the embodiment 18 of FIG. 3 comprises four light-sensitive regions 26-29 arranged on a p-type silicon substrate 31 wherein a thin layer of n+Si 32 is applied, over which an oxide layer 33 is arranged (FIG. 4, 5). Arranged on the oxide layer 33 are regions 34, 36, 37, 38, 39 of varying conductivity of polysilicon. In addition a region 41 of polysilicon is applied close to each of the light-sensitive regions 26-29. Applied over the polysilicon layers is a thick oxide layer 42 whereover is arranged a light-screening layer 43, for instance of aluminium.

The polysilicon regions 34, 36, 37, 38, and 39 are subject to three-phase control, as known in CCD techniques. Conducting paths 44, 45, 46 and 47 which can be connected to the layers of polysilicon are indicated schematically. The aluminium layer 43 is interrupted at the light-sensitive region 29 whereby electron-hole pairs are generated in the layers 31 and 32 thereunder. Via the region 41 these charge carriers are sent to below a layer 38, whereafter the charge carriers are transported in parallel to the radial drain means 23. The charge carriers shifted along the circle are carried into the radial drain means 23 using a coupling element 51 shown schematically in FIG. 6. After an electrode 52

Figure 6:
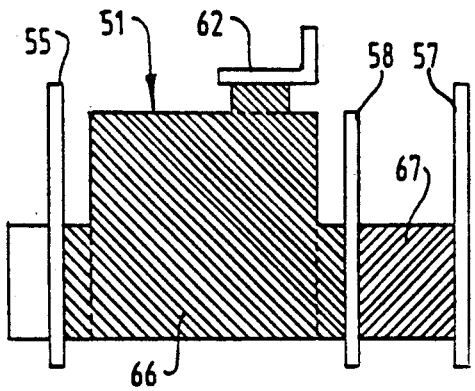
FIG. 6 shows a diagram of another detail of the structure of FIG. 3.
Figure 7:
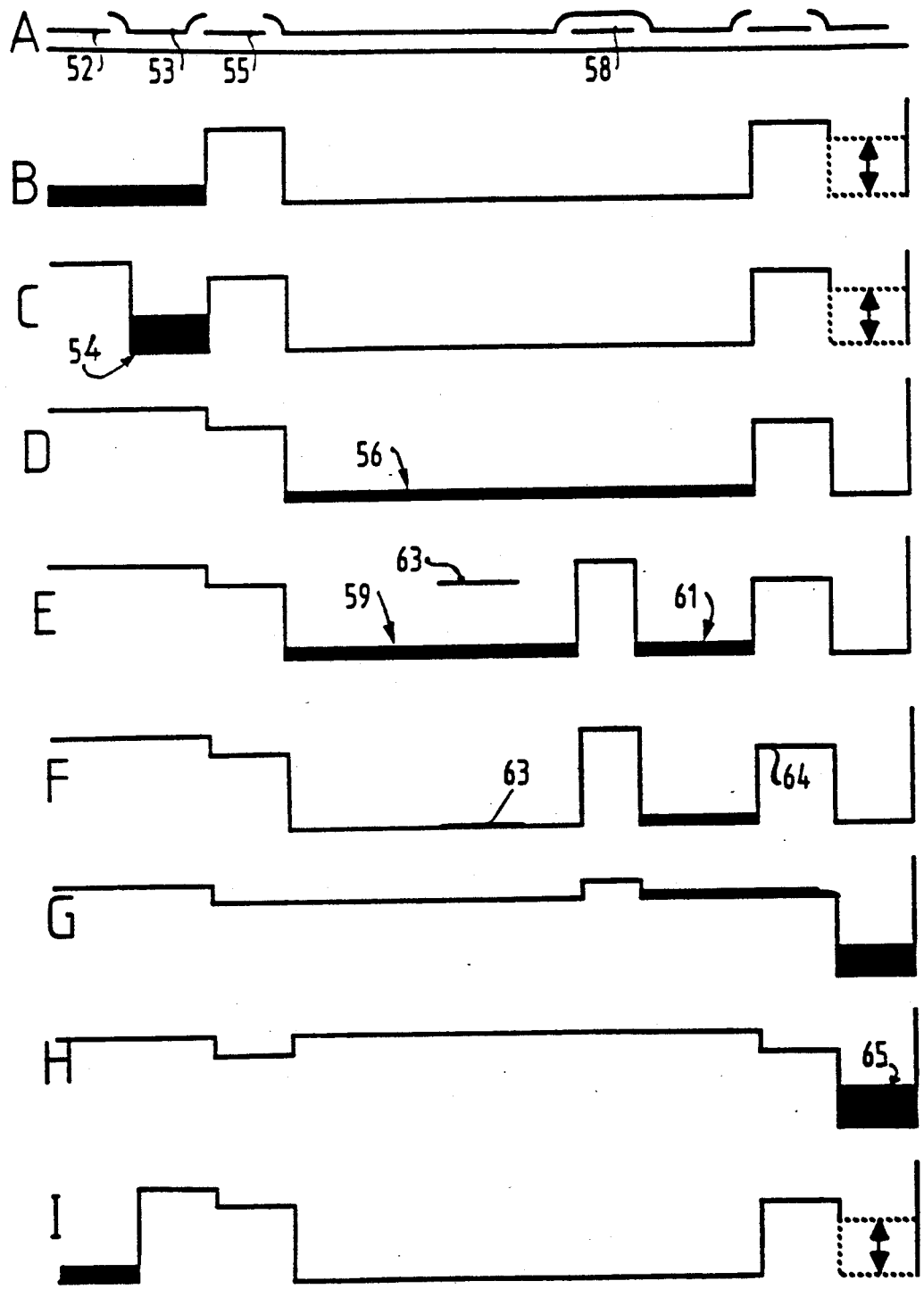
FIGS. 7A-7I show signal diagrams to elucidate the operation of the embodiment of the invention of the diagram of FIG. 6.

(FIGS. 7A, 7C, wherein negative voltage levels are indicated in upward direction) has obtained a high value after the situation drawn in FIG. 7B, the charge carriers are collected in a potential well 54 beneath a relevant electrode of a circular shift register. In order to apply a negative voltage to electrode 53 (FIG. 7B) to a level beyond a level on an electrode 55 (FIG. 6) the charge carriers are carried into the potential well 56 distributed evenly between electrode 55 and an electrode 57 of the radial drain means. By applying a negative voltage to electrode 58 (FIG. 7E) the potential well 56 is divided into two parts 59, 61, whereafter the charge carriers in the part of the well 59 can be drained using an electrode 62 (FIGS. 7E, 7F), wherein level 63 indicates the voltage level on the electrode 62. By increasing the voltage above the potential well 61 the charge is subsequently carried over potential barrier 64 into the potential well 65, after which it can be clocked through, for instance at a frequency of 1 MHz in the radial direction, wherein the cycle can repeat itself in FIG. 7I.

Selecting the ratio between the size of the regions 66 and 67 in FIG. 6 determines the portion of the charge carriers that reaches the radial drain means 23 of FIG. 3. The ratio between the regions 66 and 67 will therefore differ in different rings of the radiation-sensitive sensor.

Figure 8:
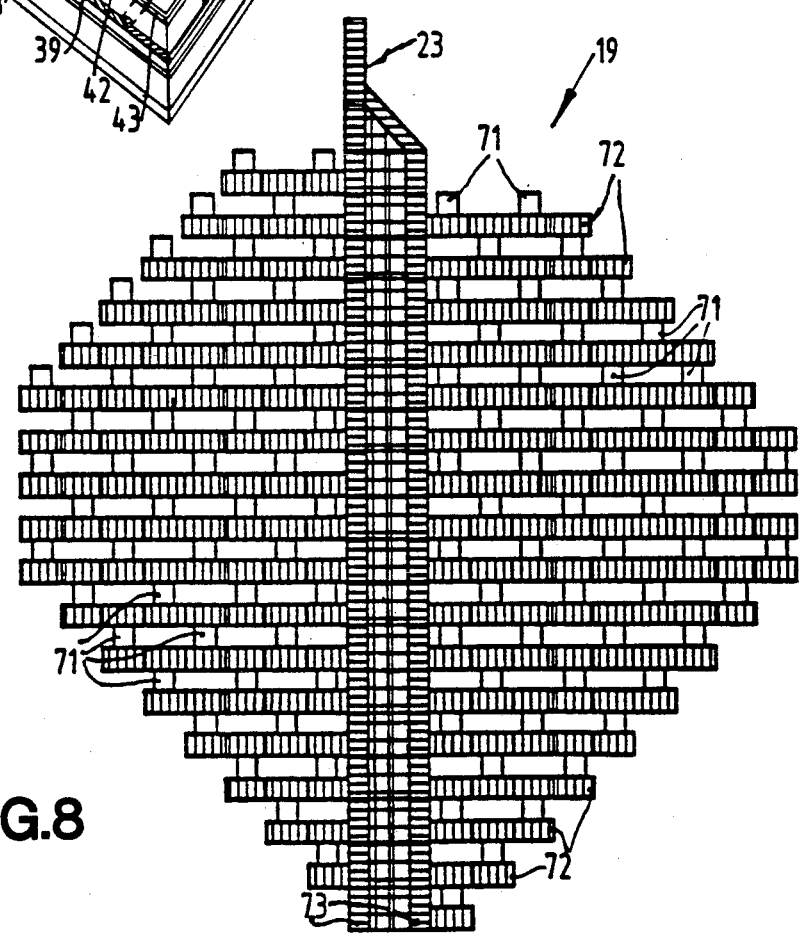
FIG. 8 shows a diagram of detail VIII from FIG. 3.

The central portion 19 of the preferred embodiment 18 of FIG. 3 preferably comprises radiation-sensitive elements 71 that are coupled to rectilinear registers 72 which are in turn coupled to registers 73 extending at right angles thereto which converge to the radial drain means 23 (FIG. 8). The radiation-sensitive elements are in preference each arranged staggered in the direction parallel to the drain means 23.

We claim:

1. Radiation-sensitive device, comprising:
a plurality of radiation-sensitive elements in a substantially circular arrangement, the radiation-sensitive elements having a density that decreases radially, each radiation sensitive element generating an electrical signal in response to radiation;
drain means for draining electrical signals; and
transfer means for coupling the electrical signals from the radiation-sensitive elements to the drain means.

2. Radiation-sensitive device as claimed in claim 1, wherein
each radiation sensitive element comprises a circular charge-coupled device, and
the radiation sensitive elements are arranged concentrically.

3. Radiation-sensitive device as claimed in claim 2, wherein the circular charge-coupled device includes a three-phase control.

4. Radiation-sensitive device as claimed in claim 1, wherein the radiation sensitive elements are arranged to form a plurality of ring segments, each ring segment comprising a plurality of radiation-sensitive elements in the form of a circle.

5. Radiation-sensitive device as claimed in claims 1, 2 or 4, additionally comprising a central charge-coupled device.

6. Radiation-sensitive device as claimed in claim 5, additionally comprising a radial charge-coupled device.

7. Radiation-sensitive device as claimed in claim 6, wherein the transfer means is for transferring electrical signals from the radiation sensitive elements in a substantially circular arrangement to the radial charge-coupled device.

8. Radiation-sensitive device as claimed in claim 1, 2, or 4, additionally comprising a radial charge-coupled device.

9. Radiation-sensitive device as claimed in claim 8, wherein the transfer means is for transferring electrical signals from the radiation sensitive elements in a substantially circular arrangement to the radial charge-coupled device.

* * * * *

UNITED STATES PATENT AND TRADEMARK OFFICE
CERTIFICATE OF CORRECTION

PATENT NO. : 5,166,511

DATED : Nov. 24, 1992

INVENTOR(S) : KREIDER ET AL.

It is certified that error appears in the above - identified patent and that said Letters Patent is hereby corrected as shown below:

On the Title page,
item [75] Inventors:, please add as inventor:

--Jan van der Spiegel, Philadelphia, PA--

Signed and Sealed this

Nineteenth Day of October, 1993

Attest:

BRUCE LEHMAN

Attesting Officer　　Commissioner of Patents and Trademarks